July 21, 1964 D. L. FAVIN 3,142,019

UNBALANCED-TO-BALANCED AMPLIFIER

Filed Oct. 11, 1961

INVENTOR
BY D. L. FAVIN
Charles Scott Phelan
ATTORNEY

United States Patent Office 3,142,019
Patented July 21, 1964

3,142,019
UNBALANCED-TO-BALANCED AMPLIFIER

David L. Favin, Whippany, N.J., assignor to Bell Telephone Laboratories, Incorporated, New York, N.Y., a Corporation of New York Filed Oct. 11, 1961, Ser. No. 144,464
9 Claims. (Cl. 330—14)

Figures 1, 2:
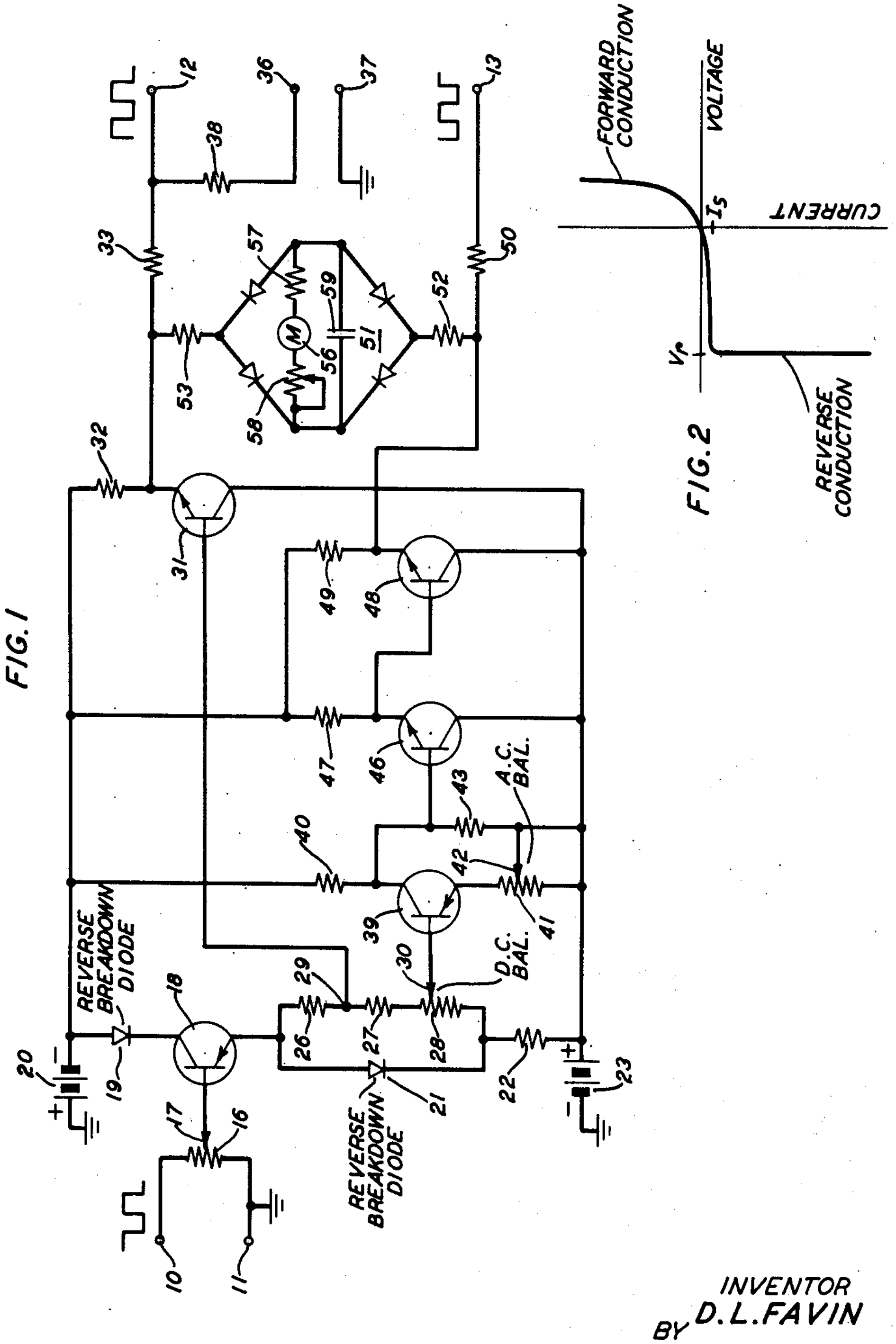

This invention relates to an amplifier circuit; and, more particularly, it relates to amplifiers for converting unbalanced electric signals to balanced electric signals.

In electric circuit systems it is frequently necessary to convert an electric signal which is unbalanced with respect to some predetermined reference potential level into a corresponding electric signal which is balanced with respect to that same potential level. An unbalanced signal is, at any given transverse plane in a circuit, unsymmetrical with respect to the reference potential level. A balanced signal is, at any given transverse plane in a circuit, symmetrical with respect to the reference voltage level, i.e., the voltages at the plane in the two circuit conductors are equal in magnitude and opposite in polarity, and the currents are equal in magnitude and flow in opposite directions. There are a number of different structures known in the art for performing unbalanced-to-balanced conversions, and each structure usually provides some means for adjusting the balance condition in the output of the circuit. Normally, however, precise adjustments of output balance are difficult to realize because a balanced signal includes both alternating-current and direct-current energy components, and these components may be differently affected by any balancing adjustment in prior art circuits.

It is, therefore, one object of the invention to improve unbalanced-to-balanced signal converters.

Another object is to convert unbalanced electric signals into balanced signals in a circuit wherein alternating-current and direct-current balance adjustments for the output signal are separately controlled.

Another object is to convert electric signals from an unbalanced configuration to a balanced configuration in a circuit wherein alternating-current and direct-current balance adjustments are performed by separate and relatively independent structures.

An illustrative embodiment of the invention utilizes a resistive potential divider shunted by a reverse breakdown diode, or other impedance device having essentially zero impedance to alternating-current components of signals to be amplified. Taps on the potential divider are at different direct potentials but at substantially the same alternating signal potential as long as the diode is reversely biased by a sufficient amount so that input signals cannot remove it from its reverse conduction condition. The characteristics of such a diode, which are well known in the art, will be hereinafter outlined. Unbalanced electric signals are applied to the terminals of the divider, and corresponding signals appearing at the divider taps are coupled to output terminals with opposite phases with respect to one another. By adjusting the gain of the coupling means between the taps and the output terminals the alternating-current balance condition of the output signals may be controlled and by adjusting the relative positions of the taps on the divider the direct-current balance condition of the output may be controlled.

Featured structure of the invention includes a combination of a potential divider shunted by a reverse breakdown diode which is biased for conduction in its reverse direction for forcing taps on the potential divider to be at the same alternating-current potential even though they are at different direct potentials.

In accordance with a feature of the invention, a circuit having two output terminals at different direct potentials, but at the same alternating potential, is utilized for coupling unbalanced electric signals to two circuits for applying the signals with opposite phases to an output connection as a balanced version of the unbalanced signals. Alternating-current balance of the output may be controlled by adjusting the gain of one of the two circuits, and direct-current balance may be controlled by adjusting the relative magnitudes of the direct potentials at the inputs to the two circuits.

An additional feature of the invention is that in a circuit for converting unbalanced signals into balanced signals adjustments of the alternating and direct potential balances of the output may be independently performed.

One embodiment of the invention which illustrates the principal, advantageous characteristics thereof, and shows one way in which the objects of the invention may be realized, is described in the following portions of the specification, including the appended claims, and shown in the attached drawing in which:

FIG. 1 is a schematic diagram of an amplification circuit in accordance with the invention; and FIG. 2 is a diagram of the voltage versus current characteristic of a typical reverse breakdown diode.

In FIG. 1 input signals, such as the rectangular input signal wave illustrated at the input terminals 10 and 11, are converted by the illustrated amplifier into balanced output signals appearing at output terminals 12 and 13. Typical complementary output signals of the type produced are illustrated adjacent to the output terminals. A potential-dividing resistor 16 is connected between input terminal 10 and the input terminal 11, which is also connected to ground. An adjustable tap 17 on the resistor 16 is provided for coupling input signals to the base electrode of a transistor 18 that is connected in a common emitter configuration. This transistor is illustrated as a p-n-p transistor and has its collector electrode connected through a current limiting reverse breakdown diode 19 to the negative terminal of a battery 20, which has the positive terminal thereof grounded.

Diode 19 is a well-known type, having a voltage versus current characteristic such as that illustrated in FIG. 2. The application of a small forward voltage biases the diode for forward conduction of electric current from its anode to its cathode. When biased in the reverse direction, the diode presents a high impedance to current flow until the reverse biasing voltage exceeds a predetermined value, such as $V_r$, at which reverse breakdown takes place. Thereafter the diode may conduct variable amounts of current with substantially no change in the potential difference between its terminals as long as a minimum potential difference of $V_r$ is maintained across the diode and as long as a minimum sustaining current $I_s$ is also present.

The emitter electrode of transistor 18 is connected through a second reverse breakdown diode 21 and a resistor 22 to the positive terminal of a battery 23, which has the negative terminal thereof grounded. In this configuration diodes 19 and 21 are normally biased in their reverse conducting conditions so that input signal variations at terminals 10 and 11 are unable to affect the conduction of transistor 18 sufficiently to remove these diodes from their reverse conducting conditions. Three resistors 26, 27, and 28 are connected in series with resistor 22 between the emitter electrode of transistor 18 and battery 23 to form a potential divider wherein diode 21 shunts resistors 26, 27, and 28. In this common emitter arrangement diode 19 serves in a potential limiting capacity to control the collector potential of transistor 18. Diode 21, in accordance with the invention, fixes the total direct potential difference across resistors 26, 27, and 28 at a constant value. Accordingly, signal variations which appear at the terminals of this combination of three resistors are unable to change the relative potentials of intermediate points with respect to one another in the combination of resistors. Changes in current generated by such signal variations are absorbed by diode 21 in its reverse conducting condition.

A fixed tap 29 is provided on the potential divider at the common terminal of resistors 26 and 27. An adjustable tap 30 is provided on the resistor 28. These taps are at different direct potentials, but they are always at the same alternating potential.

Tap 29 is connected to the base electrode of an n-p-n transistor 31 which has its collector electrode connected to battery 23 and its emitter electrode connected through a resistor 32 to battery 20. In carrying out the invention, it is advantageous if the no-signal potential with respect to ground at the base electrode of transistor 18 is the same as the potential with respect to ground at the emitter electrode of transistor 31. Since these two transistors are of opposite conductivity types, the base-emitter potential differences of the two are of opposite polarity and tend to offset one another. Resistor 26 is assigned a resistance value of appropriate size for developing a potential difference in the absence of input signals to produce the desired electrode potential equality.

Thus, output terminal 12, which is connected through a resistor 33 to the emitter electrode of transistor 31, is at ground when the base electrode of transistor 18 is at ground; and the potential of terminal 12 rises or falls at the same time that input signal potentials at the base electrode of transistor 18, and at tap 29, rise or fall. In other words, signal variations appearing at tap 17 correspond to those appearing at tap 29, are amplified by transistor 31, and appear at output terminal 12 with no phase reversal. An auxiliary pair of output terminals 36 and 37 is provided with terminal 36 connected to terminal 12 through a resistor 38 and with terminal 37 connected to ground. This last set of terminals is provided in the event that an unbalanced signal may also be desired for some application of the circuit of FIG. 1.

Adjustable tap 30 is connected to the base electrode of a p-n-p transistor 39, which is connected in the common emitter configuration. A resistor 40 connects the collector electrode of this transistor to source 20, and a resistor 41 connects its emitter electrode to source 23. A slider 42, which is connected to source 23, is provided for short-circuiting variable amounts of the resistance of resistor 41. A resistor 43 connects slider 42 to the collector electrode of transistor 39. This transistor circuit arrangement is adapted to provide substantially unity gain with a 180-degree phase change between the base and collector electrodes of the circuit. The exact value of the gain may be controlled by adjusting slider 42. Adjustments of tap 30 cause the direct-current operating point of transistor 39 to be changed.

A connection from the collector electrode of transistor 39 to the base electrode of an n-p-n transistor 46 causes transistor 46 to be driven by the phase-inverted signals from tap 30. Transistor 46 has its collector electrode directly connected to battery 23 and its emitter electrode connected through a resistor 47 to battery 20. An n-p-n transistor 48 is arranged in another circuit that is similar to the circuit of transistor 46. The collector electrode of transistor 46 is connected directly to battery 23, and the emitter electrode is connected through a resistor 49 to battery 20. A connection from the emitter electrode of transistor 46 to the base of transistor 48 causes the latter transistor to be driven in much the same fashion as transistor 46.

It has been found convenient to make resistor 49 much smaller than resistor 47 so that the circuit of transistor 46 functions as an impedance transformer. Thus, the relatively high base-collector impedance of transistor 46 is presented to the circuit of transistor 39 to receive signals from the latter transistor without loading down the circuit of transistor 39 and thereby affecting its gain setting. On the other hand, however, the relatively low collector-emitter impedance of transistor 46 is presented to the input circuit of transistor 48 and provides a low impedance supply path for base current to the latter transistor.

Since the transistors 46 and 48 are of the same conductivity type and are arranged in emitter-follower configurations, there is no phase inversion through those two stages. Accordingly, signal variations at tap 30 are inverted at transistor 39 and appear at the emitter electrode of transistor 48 with opposite phase with respect to the phase at tap 30. These signals at the emitter of transistor 48, which are also of opposite phase with respect to the signals at the emitter electrode of transistor 31, are coupled through a resistor 50 to output terminal 13.

A full wave rectifier bridge 51 is connected in series with resistors 52 and 53 between the emitter electrodes of transistors 31 and 48. A meter 56 is connected in series with a current limiting resistor 57 and a calibrating resistor 58 across one diagonal of the rectifier bridge to provide an indication of the level of output signals in the circuit of FIG. 1. A capacitor 59 is also connected across the same bridge diagonal to cause the meter to be responsive to peak output signal amplitudes in a well-known manner.

In order to adjust the circuit of FIG. 1 for proper unbalanced-to-balanced signal conversion, an input signal of any suitable standard configuration is applied to input terminals 10 and 11. An oscilloscope (not shown) may then be connected to the emitter electrode of transistor 31 and the oscilloscope gain adjusted so that the trace of the signal at that electrode lies between two predetermined, fixed, reference, voltage lines on the screen of the oscilloscope. Next, the oscilloscope connection is transferred to the emitter electrode of transistor 48, and the alternating-current balance tap 42 is adjusted to change the gain of the circuit of transistor 39 until the signal trace in the oscilloscope display lies in the same relative position with respect to the two reference voltage lines as it did when the oscilloscope was connected to transistor 31. When this adjustment has been completed the alternating-current signals at the emitter electrodes of the two transistors have the same amplitude with respect to the common reference voltage level, which is ground in the embodiment of FIG. 1, that is to be used for the balanced signals.

Direct-current balancing of the circuit of FIG. 1 is accomplished by removing all input signals from terminals 10 and 11 and connecting a voltmeter (not shown) between the emitter electrodes of transistors 31 and 48. This voltmeter must, of course, have a relatively high input impedance so that it does not impose a load upon the circuit. Now the direct-current balance tap 30 is adjusted to produce a zero reading on the voltmeter thereby indicating that emitter electrodes of transistors 31 and 48 are at the same direct-current level. The amplifier of FIG. 1 is now completely balanced, and normally no further adjustment is required. The change in the direct potential level at the base electrode of transistor 39 simply slides the operating point of the transistor along its characteristic to a different level without significantly affecting the gain of the transistor. The alternating-current balance of the over-all amplifier is not disturbed because all intermediate points of the potential divider including resistors 26 through 28 are at the same alternating-current potential, as previously described.

The illustrative embodiment presented in FIG. 1 is only one possible arrangement for implementing the underlying concepts of the invention. Other embodiments utilizing such concepts and which will be obvious to those skilled in the art are, of course, included within the spirit and scope of the invention.

What is claimed is:

1. An amplifier circuit comprising a source of potential, a potential divider including a plurality of resistors connected in series across said source of potential, a reverse breakdown diode connected to shunt at least a part of said resistors, means applying electric signals to said potential divider, a first amplifier stage connected to amplifying signal variations at an intermediate circuit point in said part resistors, a second amplifier stage, means connecting the input of said second amplifier to an intermediate circuit point in said part resistors, said connecting means including phase inverting means, and output connections for said amplifier circuit at the outputs of each of said amplifier stages.

2. An amplification circuit comprising a potential divider having a plurality of resistors connected in series between the terminals of a potential source, a reverse breakdown diode connected to shunt at least a part of said resistors and poled for reverse conduction of current from said source, said diode having a reverse breakdown voltage such that it is biased in its reverse conducting condition by said source, means applying electric signals to said potential divider, two output terminals, and means connected to said divider for coupling signal variations at the shunted resistors to said terminals with opposite phase.

3. An amplifier circuit for converting electric signals which are unbalanced with respect to a predetermined voltage level into signals which are balanced with respect to the same level, said circuit comprising a common emitter transistor amplifier stage including a transistor having base, emitter, and collector electrodes, a resistor connecting the emitter and collector electrodes of said transistor in series between the terminals of a source of potential, and a reverse breakdown diode shunting at least a part of said resistor, means applying to the base electrode of said transistor electric signal variations that are unbalanced with respect to a predetermined voltage level which is between the voltage levels of said terminals, two output terminals, a first amplifier coupling signal variations at said resistor part to one of said output terminals, a second amplifier for coupling substantially the same signal variations to the other output terminal, and phase inverting means connecting the signals from said resistor part to the input of said second amplifier.

4. An amplifier for converting unbalanced electric signals to balanced electric signals, said amplifier comprising a potential divider including a resistor connected between the terminals of a source of potential, a reverse breakdown diode shunting a part of said resistor and poled for the reverse conduction of current from said source, means applying unbalanced electric signals to said potential divider, a first transistor having base, emitter, and collector electrodes, means connecting the emitter and collector electrodes of said transistor in series between the terminals of said source, a connection from the base electrode of said first transistor to said resistor part, a second transistor having base, emitter, and collector electrodes, means connecting the emitter and collector electrodes of said second transistor between the terminals of said source, a phase inverter having its input connected to said resistor part, means connecting the output of said phase inverter to the base electrode of said second transistor, two output connections coupled to the emitter electrodes of said first and second transistors, respectively, and means adjusting the electric connection position on said resistor part of said phase inverter input for balancing the no-signal output potentials at said output connections.

5. An amplifier circuit for converting unbalanced electric signals to balanced electric signals, said amplifier comprising means receiving unbalanced electric signals, said receiving means including two output connections at different direct potentials and including means holding each of said output connections at essentially the same alternating potential as the other, two output terminals for said amplifier circuit, a first amplification circuit coupling one of said receiving means output connections to one of said amplifier output terminals with no phase inversion, a second amplification circuit coupling the other one of said receiving means output connections to the remaining one of said amplifier output terminals with inverted phase, means in one of said first or second amplification circuits adjusting the gain thereof for balancing signal amplitudes at said output terminals, and adjusting means in said receiving means for changing the direct potential difference between said receiving means output connections to change the direct potential magnitude at said amplifier output terminals.

6. An amplifier comprising means receiving unbalanced electric signals and reproducing those signals at two output connections at different direct potential levels, said receiving means including a signal bypass connected to said output connections so that each of said connections operates at essentially the same signal level as the other, two amplifier output terminals, means coupling the reproduced electric signals at each of said receiving means output connections to a different one of said amplifier output terminals, said coupling means including means adjusting the relative amplitudes of signal variations at said output terminals, and said receiving means including means adjusting the direct potential difference between said direct potential levels for adjusting the relative magnitude of the direct potentials at said output terminals.

7. An amplification circuit comprising a first transistor having base, emitter, and collector electrodes, means connecting said transistor in the common emitter configuration and comprising a source of potential having first and second terminals at different potential levels and having a third terminal at an intermediate potential level between the levels of said first and second terminals, means applying electric signals between said third terminal and said base electrode, a connection from said collector electrode to said first terminal of said source, first and second resistors connecting said emitter electrode to said second terminal of said source, an asymmetrical conduction device shunting said first resistor and having one terminal thereof directly connected to said emitter electrode, said device being characterized by a conduction condition in which current changes within a predetermined range produce substantially no changes in the potential difference between the device terminals, said device being poled for operation in said conduction condition in response to forward current flow in the emitter electrode of said transistor, a second transistor having base, emitter, and collector electrodes and being of opposite conductivity type with respect to said first transistor, said second transistor having its collector and emitter electrodes connected between said first and second terminals of said source for the forward conduction therethrough of current from said source, a first tap on said first resistor, a connection between said first tap and the base electrode of said second transistor, said tap arranged so that the potential difference between the emitter electrode of said first transistor and said first tap is of proper magnitude to make the emitter electrode of said second transistor at the same no-signal potential as the base electrode of said first transistor, third and fourth transistors each having base, emitter, and collector electrodes and being of the same conductivity type as said second transistor, means connecting the collector-emitter paths of said third and fourth transistors between said first and second terminals of said source for the forward conduction of current from said source, the last-mentioned connecting means including resistance means connected therein and tending to direct substantially more current through said fourth transistor than through said third transistor, a connection from the emitter electrode of said third transistor to the base electrode of said fourth transistor, amplifier output terminals connected to the emitter electrodes of said second and fourth transistors, respectively, a fifth transistor of the same conductivity type as said first transistor and having base, emitter, and collector electrodes, a connection from the collector electrode of said fifth transistor to the base electrode of said third transistor, a connection from the base electrode of said fifth transistor to an adjustable tap in electric circuit engagement with said first resistor for adjusting the relative magnitudes of the no-signal voltages at said output terminals, and means connecting the collector and emitter of said fifth transistor between said first and second terminals of said source for the forward conduction of current from said source, the last-mentioned connection means including another resistor connected in the emitter circuit of said fifth transistor, and adjustable means for short-circuiting variable amounts of said another resistor for controlling the gain through said fifth transistor to balance signal voltages at said output terminals.

8. In an amplifier for converting unbalanced electric signals to balanced electric signals by applying the unbalanced electric signals to two different circuits, one of which circuits inverts the phase of said signals, the improvement which comprises a resistive potential divider, a nonlinear impedance device shunting at least a part of said divider, said device being characterized by a conduction condition wherein current changes do not develop corresponding potential difference changes, a source of direct current biasing said device to said condition, means connected to said divider for applying both said unbalanced electric signals and current from said source to said divider, and taps on said divider connected to said two circuits, one of said taps being adjustable with respect to the other one.

9. An amplification circuit for electric signals which may include alternating currents, said circuit comprising a resistive potential divider, a direct potential source connected to said divider, an impedance device having a conduction condition in which it has substantially no impedance to alternating currents at the frequencies of said signals, means connecting said device to shunt at least a part of said divider, said device being biased to said condition by said source, means connected to said divider applying said electric signals to said divider, two output terminals, and means connected to said divider for coupling said signals from the shunted part of said divider to said terminals with opposite phase with respect to one another.

References Cited in the file of this patent

UNITED STATES PATENTS

| | | |
|---|---|---|
| 2,618,711 | Bourget | Nov. 18, 1952 |
| 2,850,650 | Meacham | Sept. 2, 1958 |